United States Patent
Manushi et al.

(10) Patent No.: US 9,515,398 B2
(45) Date of Patent: Dec. 6, 2016

(54) MECHANICAL SPACER WITH NON-SPRING ELECTRICAL CONNECTIONS FOR A MULTIPLE PRINTED CIRCUIT BOARD ASSEMBLY

(71) Applicant: Robert Bosch GmbH, Stuttgart (DE)

(72) Inventors: Ligor Manushi, Northville, MI (US); John Janson, Plymouth, MI (US); Keith Gerber, West Bloomfield, MI (US); Hiram Avalos, Ann Arbor, MI (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/091,706

(22) Filed: Nov. 27, 2013

(65) Prior Publication Data

US 2014/0148020 A1 May 29, 2014

Related U.S. Application Data

(60) Provisional application No. 61/730,704, filed on Nov. 28, 2012.

(51) Int. Cl.
*H01R 12/52* (2011.01)
*H05K 1/14* (2006.01)

(52) U.S. Cl.
CPC ............. *H01R 12/52* (2013.01); *H05K 1/144* (2013.01); *H05K 2201/042* (2013.01); *H05K 2201/10409* (2013.01); *H05K 2201/2036* (2013.01)

(58) Field of Classification Search
CPC .................................................... H01R 12/721
USPC ........ 439/66, 91, 591; 361/804, 770; 365/56
See application file for complete search history.

(56) References Cited

U.S. PATENT DOCUMENTS

| | | | |
|---|---|---|---|
| 3,924,915 A | * | 12/1975 | Conrad .............. H01R 12/7082 361/785 |
| 4,309,856 A | | 1/1982 | Varnau et al. |
| 4,444,318 A | | 4/1984 | Alexander |
| 4,952,158 A | * | 8/1990 | Nakagawa ...................... 439/96 |
| 4,969,065 A | | 11/1990 | Petri |
| 5,281,149 A | | 1/1994 | Petri |
| 5,334,029 A | | 8/1994 | Akkapeddi et al. |

(Continued)

FOREIGN PATENT DOCUMENTS

DE 4326442 2/1995
WO 2008/059643 5/2008

OTHER PUBLICATIONS

International Preliminary Report on Patentability and Written Opinion for Application No. PCT/US2013/072189 dated Jun. 11, 2015 (6 pages).

*Primary Examiner* — Amy Cohen Johnson
*Assistant Examiner* — Oscar C Jimenez
(74) *Attorney, Agent, or Firm* — Michael Best & Friedrich LLP

(57) ABSTRACT

A spacer and electrical connector assembly for printed circuit boards includes a first member to be placed between two of the printed circuit boards to provide a required spacing between the printed circuit boards. The assembly also includes at least one second member disposed adjacent to the first member, the second member extending along a length of the first member and at least partially bracketing an upper surface and a lower surface of the first member, thereby providing an electrical connection between the printed circuit boards. A plurality of contact portions that respectively receive the second member may be disposed on at least one of the upper and lower surfaces.

11 Claims, 5 Drawing Sheets

(56) References Cited

U.S. PATENT DOCUMENTS

| | | | |
|---|---|---|---|
| 5,345,366 A * | 9/1994 | Cheng et al. | 361/785 |
| 6,038,140 A * | 3/2000 | Petri | 361/804 |
| 6,124,552 A | 9/2000 | Boe | |
| 6,280,202 B1 | 8/2001 | Alden, 3rd et al. | |
| 6,535,394 B1 * | 3/2003 | Hirzmann | 361/761 |
| 6,543,098 B2 * | 4/2003 | Meyer et al. | 24/289 |
| 7,331,798 B2 * | 2/2008 | Yoshida | H01R 12/7005 439/67 |
| 7,544,064 B2 * | 6/2009 | Gilliland | 439/74 |
| 7,762,819 B2 * | 7/2010 | Mori | H05K 1/144 439/66 |
| 7,876,573 B2 * | 1/2011 | Motohara | H05K 1/144 361/770 |
| 8,441,275 B1 * | 5/2013 | Alladio | G01R 1/0466 324/756.01 |
| 2001/0002875 A1 | 6/2001 | Prabonnaud et al. | |
| 2001/0053068 A1 * | 12/2001 | Murayama et al. | 361/760 |
| 2002/0177345 A1 | 11/2002 | Daugherty et al. | |
| 2005/0184381 A1 * | 8/2005 | Asahi | H01R 13/2414 257/693 |
| 2005/0260867 A1 | 11/2005 | Ono et al. | |
| 2007/0279890 A1 | 12/2007 | Motohara et al. | |
| 2009/0215287 A1 | 8/2009 | Mori et al. | |
| 2009/0268423 A1 | 10/2009 | Sakurai et al. | |
| 2010/0255690 A1 | 10/2010 | Waite et al. | |

* cited by examiner

MECHANICAL SPACER WITH NON-SPRING ELECTRICAL CONNECTIONS FOR A MULTIPLE PRINTED CIRCUIT BOARD ASSEMBLY

RELATED APPLICATIONS

This application claims the benefit of U.S. Provisional Application No. 61/730,704, filed on Nov. 28, 2012, the entire contents of which are incorporated herein by reference.

BACKGROUND

The present invention relates to a mechanical spacer with built in, non-spring electrical contacts to be placed in a multiple printed circuit board (PCB) assembly to create an electrical connection between circuit paths of upper and lower circuit boards. Alternatively, one or both of the upper and lower circuit boards could be replaced with another circuit-based construction (e.g., LTCC, MID, etc.).

A conventional PCB includes a plurality of electronic components, and is generally formed with a plurality of circuit paths for establishing electrical connection among the electronic components. The maximum number of circuit paths is proportional to the overall surface area of the printed circuit board. Printed circuit boards are often designed in multi-layered forms, thereby increasing the total surface area for forming circuit paths and for assembling the electronic components thereon.

A plurality of spacer contact posts are conventionally sandwiched between the upper and lower circuit boards to create connection of the circuit paths of the circuit boards with each other and to facilitate heat-dissipation.

SUMMARY OF THE INVENTION

In one embodiment, a spacer and electrical connector assembly for printed circuit boards is provided. The assembly includes a first member configured to be placed between two of the printed circuit boards to provide a required spacing between the printed circuit boards; at least one second member disposed adjacent to the first member, the second member extending along a length of the first member and at least partially bracketing an upper surface and a lower surface of the first member, thereby providing an electrical connection between the printed circuit boards. The assembly also includes a plurality of contact portions disposed on at least one of the upper and lower surfaces.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

DETAILED DESCRIPTION

The present invention includes a mechanical spacer 1 that holds two printed circuit boards 10, 20 (hereinafter "PCB" or "PCBs") at a set distance from each other. The spacer 1 works in conjunction with an electrical connector 40 to provide an electrical connection between the two PCBs 10, 20 without the use of spring contacts (such as Pogo pins, leaf springs, or bare springs) in order to reduce cost and complexity, while providing a reliable mechanical and electrical connection.

Figure 1A:
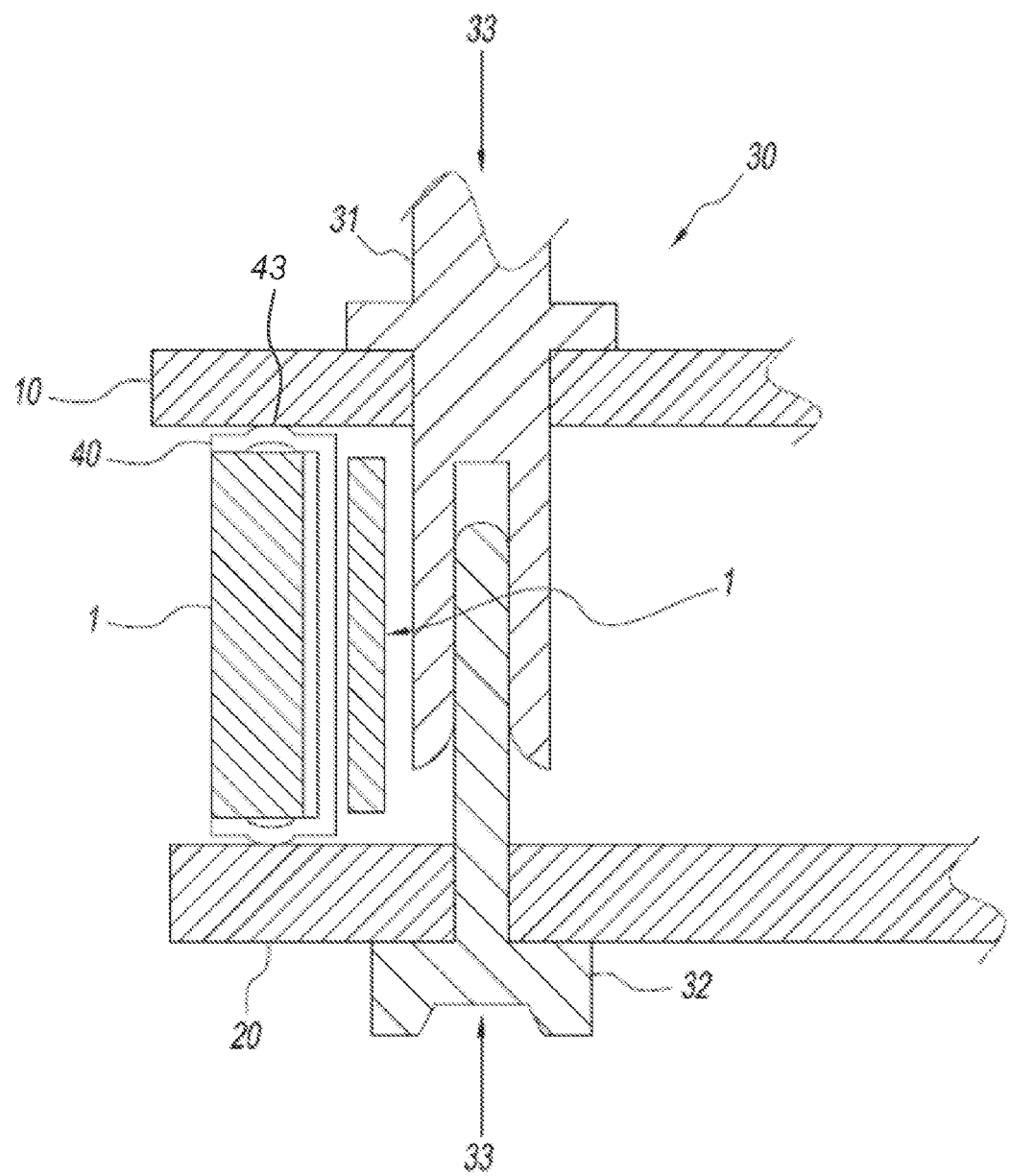
FIG. 1A is a cross-sectional view of a spacer assembly according to an embodiment of the invention.

As shown in FIG. 1A, the upper PCB 10 may be mechanically connected to the lower PCB 20 through a bushing and screw combination 30. The bushing 31 may be formed of a metal such as brass or aluminum or may be a plastic component molded directly on a product housing 61 (FIG. 3) so as not to be a separate component. In FIG. 1A, a securing member or screw 32 is inserted through the lower PCB 20 and is secured within a concavity of the bushing 31. The bushing 31 and screw 32 may optionally include male and female threads to form a secure connection, or may be otherwise joined together as known in the art. The compression load to establish the electrical connection between the PCBs 10, 20 is provided by the bushing and screw combination 30, as shown by the arrows 33.

Figure 1B:
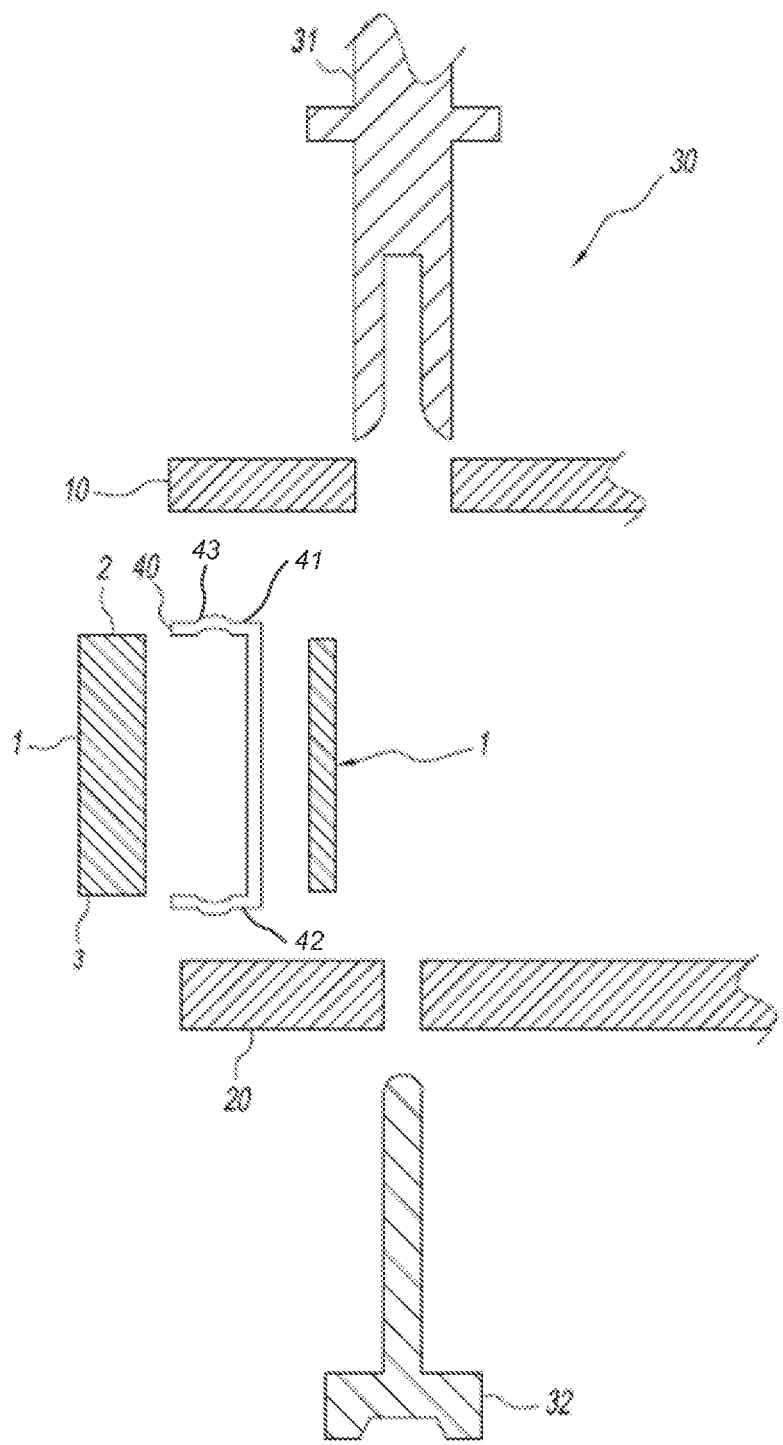
FIG. 1B is an exploded view of FIG. 1A.

With continuing reference to FIG. 1A, the spacer 1 may include a terminal 40 that has a bracket shape (C-shape) and extends along the vertical length of the spacer 1 and at least partially brackets the upper 2 and lower 3 surfaces of the spacer. However, other shapes for the terminal 40 could be used. The terminal 40 removes the need of expensive Pogo Pins and provides a more cost-effective solution to provide an electrical connection between the upper 10 and lower 20 PCBs. The terminal 40 may be in the form of a wire and may be raised above the upper surface 2 of the spacer 1 and raised below the lower surface 3 of the spacer 1 to ensure proper contact with the respective PCB 10, 20. As best shown in FIG. 1B, upper 41 or lower 42 surfaces of the terminal 40 may be respectively soldered to the upper PCB 10 or the lower PCB 20. Alternatively, the terminal 40 may not be soldered to either PCB 10, 20 and thus be a loose and easily removable piece. The upper 41 or lower 42 surface of the terminal 40 may also include a "bump" protrusion 43. The terminal 40 may be over-molded or stitched/inserted onto the spacer 40 using conventional methods.

The assembly formed by the spacer 1 and terminal 40 can be a separate piece from either of the PCBs 10, 20, and thus be a "pick and place" component that can be reflowed on one of the PCBs to reduce final manufacturing/assembly line steps. Additionally, when the spacer assembly is a separate piece, an electrically conductive adhesive or glue may be used in addition to the bushing and screw combination 30 to increase the reliability of the electrical and mechanical connections. Alternatively or additionally, a non-conductive adhesive can be used to secure the PCBs 10, 20 together to provide increased mechanical stability/resistance.

Figure 2B:
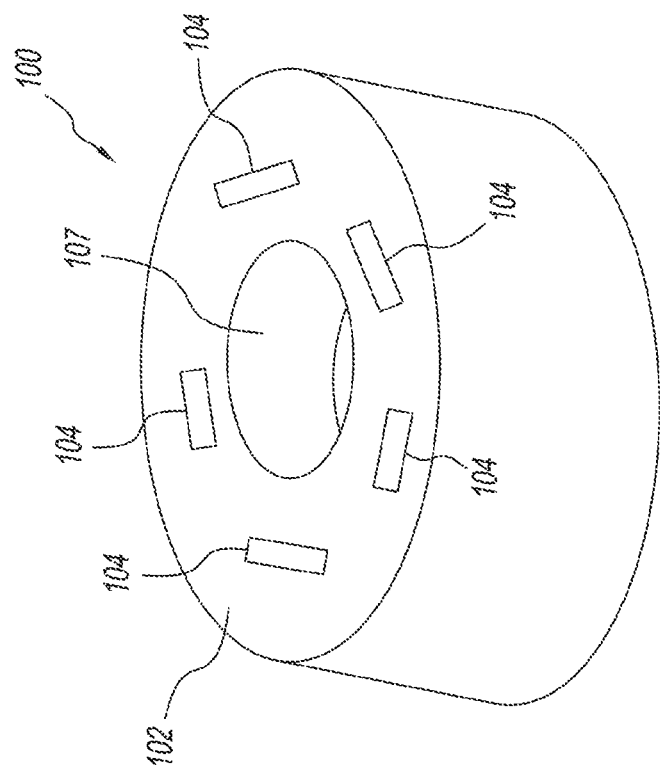
FIG. 2B is a perspective view of an alternative spacer assembly
Figure 2A:
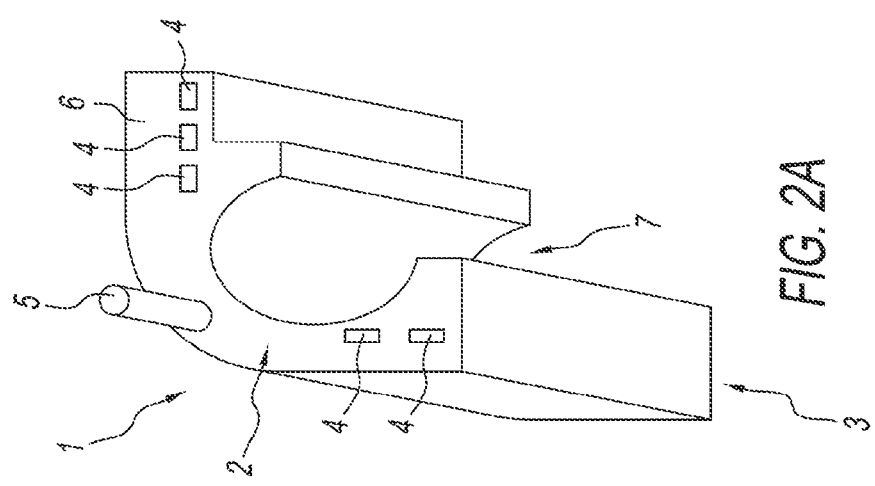
FIG. 2A is a perspective view of the spacer assembly of FIG. 1.

FIG. 2A shows a perspective view of a spacer 1 according to an embodiment of the invention. The spacer 1 may be formed of a plastic material and may have a generally L-shape with a plurality of locating pins or contacts 4 along an upper surface 2 thereof. The contacts 4 extend from the upper surface 2 to the lower surface 3. A terminal 4 may respectively be secured in one or more of the contacts 4. The contacts 4 may be flush with the surfaces 2, 3 or may be raised therefrom. A 5-contact spacer 1 is shown in FIG. 2, with the contacts 4 allowing the spacer to equally distribute a compression load among the five contacts 4 distributed along the upper surface 2 of the spacer 1. However, additional or fewer contacts 4 are possible. The spacer can also have alignment posts 5 on the upper surface 2 and the lower surface 3 that fit into a corresponding hole in the PCB 10, 20 to align the upper 2 and lower 3 surfaces with the respective PCB 10, 20. The spacer 1 may include alternate geometries or sizes to provide additional surface area 6 for contacts 4. The inside surface of the spacer 1 can have a circular opening 7, in order to fit around the bushing 31 in between the upper 10 and lower 20 PCBs. The circular opening 7 in the spacer 1 can be used in conjunction with the pin 5 to provide alignment and prevent rotation of the spacer 1.

Figure 3:
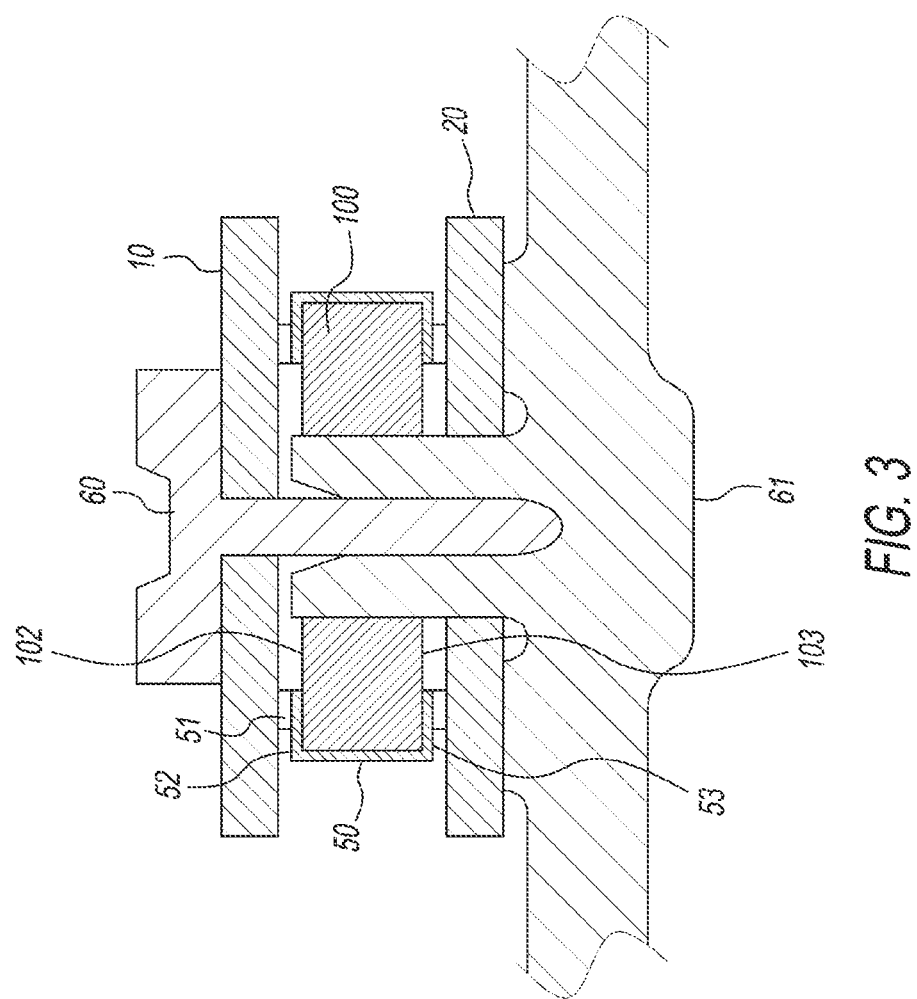
FIG. 3 is a plan view of an alternative embodiment of a spacer assembly.

In an alternative embodiment as shown in FIG. 2B, the spacer 100 may be fully circular so that it surrounds the bushing between the PCBs (FIG. 3). The spacer 100 shown in FIG. 2B is otherwise similar to the spacer 1 of FIG. 1, and includes an upper surface 102, a lower surface 103 opposite the upper surface, pins 104 and a fully-enclosed center 107.

In an alternative embodiment shown in FIG. 3, the terminal 40 may be replaced with a molded interconnect device (MID) 50. As is known in the art, a MID 50 is an injection-molded thermoplastic part with integrated electronic circuit traces printed on the thermoplastic material. As discussed above with respect to the terminal 40, the MID 50 has a bracket shape (C-shape) and extends along the vertical length of the spacer 100 and brackets the upper 102 and lower 103 surfaces of the spacer. The MID 50 may be partially spaced from the spacer 100 to ensure proper contact with the PCBs 10, 20. The upper 102 or lower 103 surface of the MID 50 may also be respectively soldered to the upper PCB 10 or the lower PCB 20. Alternatively, the MID 50 may not be soldered to either PCB 10, 20, and thus be a loose piece. As discussed above, a conductive or non-conductive adhesive may be used to strengthen the connection when the MID 50 is a separate piece. The upper surface 52 or lower surface 53 of the MID 50 may also include a "bump" protrusion. As shown in FIG. 3, the upper and/or lower surfaces of the MID may also include a pad 51, for example made of gold.

With continued reference to FIG. 3, the bushing and screw combination 30 may be replaced with a self-tapping screw 60 that fits into a bushing 61. The bushing 61 is shown molded together with the PCB housing 61, but may also be separate from the housing.

Figure 4:
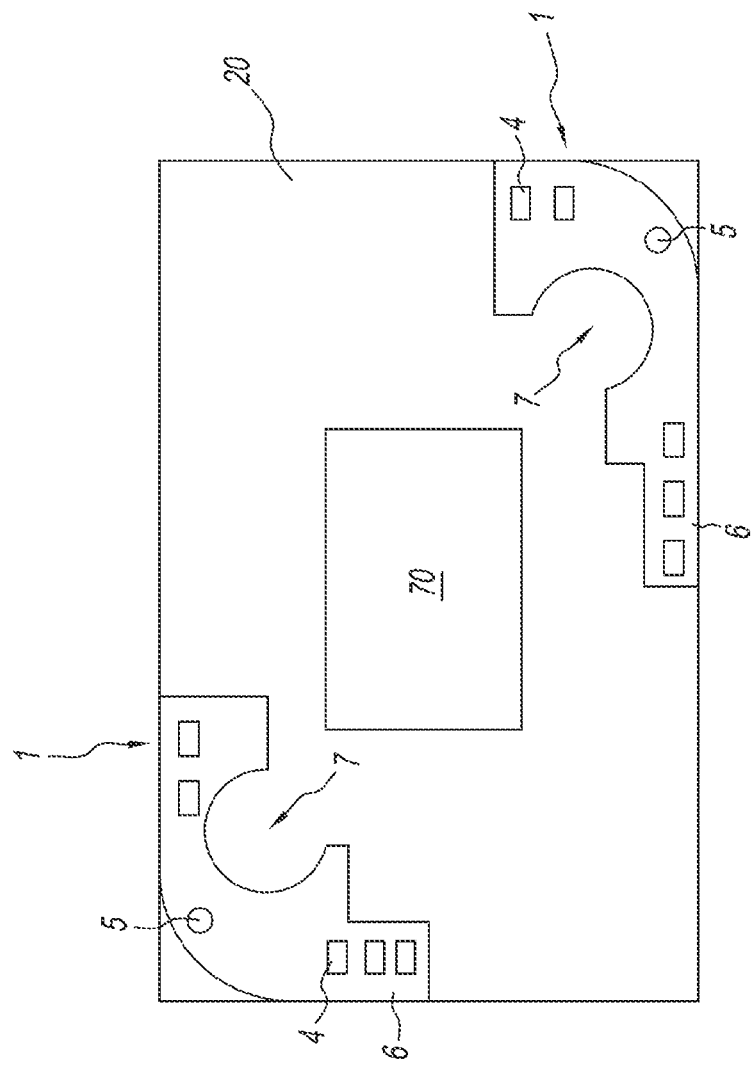
FIG. 4 is a plan view of spacers distributed on a printed circuit board.

FIG. 4 shows a plan view of two spacers 1 resting on diagonally opposite ends of a PCB 20, providing ten total contact pins. As shown, the spacers 1 are spaced apart such that a circuit component 70, such as a sensor, can be placed on the PCB 20 so as to avoid interference from the compression load 33 undertaken by the spacers 1.

While embodiments of the invention disclosed herein describe mechanical spacers for multiple printed circuit boards, one skilled in art should recognize that alternative configurations may be employed without deviating from the scope of the invention.

The invention claimed is:

1. A spacer and non-spring electrical connector assembly for printed circuit boards, the assembly comprising:
   a support member including an injection-molded thermoplastic part configured to be placed between a first printed circuit board and a second printed circuit board to provide a required spacing between the first and second printed circuit boards;
   at least one conductive member extending along a length of the support member between an upper surface and a lower surface of the support member, the conductive member providing an electrical connection between the first and second printed circuit boards at contact portions positioned at the upper and lower surfaces of the support member,
   wherein the support member includes
      a circular opening sized to receive and partially surround a bushing for coupling the support member to the first printed circuit board and the second printed circuit board, wherein the support member includes a gap in a circumference of the circular opening, and
      an alignment feature including an alignment post positioned on the upper surface of the support member proximal to the circular opening and configured to engage the first printed circuit board at a defined location such that the gap in the circumference of the circular opening is positioned on an inside surface of the support member aligning toward a circuit component on at least one of the printed circuit boards and at least one contact portion of the plurality of contact portions is aligned with a corresponding contact on the first printed circuit board when the alignment feature is engaged with the first printed circuit board and the bushing is positioned in the circular opening coupling the support member to the first printed circuit board, and
   wherein the alignment feature and the bushing in conjunction prevent rotation of the support member with respect to the printed circuit boards.

2. The assembly of claim 1, wherein the support member has a generally L-shape.

3. The assembly of claim 2, wherein a portion of the L-shape includes the circular opening.

4. The assembly of claim 1, wherein the support member is cylindrical.

5. The assembly of claim 1, wherein the conductive member has a generally C-shape.

6. The assembly of claim 1, wherein a longitudinal end surface of the conductive member is soldered to one of the first and second printed circuit boards.

7. The assembly of claim 1, wherein the conductive member is secured to one of the first and second printed circuit boards with an adhesive.

8. The assembly of claim 1, wherein the conductive member includes a protrusion on one of its longitudinal end surfaces.

9. The assembly of claim 1, wherein the alignment feature is configured to engage the first printed circuit board when the alignment post s inserted into a corresponding hole on the first printed circuit board.

10. The assembly of claim 9, wherein the support member further includes a second alignment post extended from the lower surface of the support member and configured to engage the second printed circuit board at a second defined location when the second alignment post is inserted into a second corresponding hole on the second printed circuit board such that at least one contact portion of the plurality of contact portions on the lower surface of the support member is aligned with a corresponding contact on the second printed circuit board when the second alignment post is inserted into the second corresponding hole on the second printed circuit board and the bushing is positioned in the circular opening coupling the support member to the second printed circuit board.

11. The assembly of claim 1, wherein the contact portions includes more than one contact portions positioned at the upper surface of the support member, and wherein each contact portion of the more than one contact portions positioned at the upper surface of the support member is aligned with a different corresponding contact on the first printed circuit board when the alignment feature is engaged with the first printed circuit board.

* * * * *